United States Patent [19]
Ushirokawa et al.

[11] Patent Number: 5,621,764
[45] Date of Patent: Apr. 15, 1997

[54] SOFT DECISION SIGNAL OUTPUTTING RECEIVER

[75] Inventors: Akihisa Ushirokawa; Kazuhiro Okanoue; Akira Hioki, all of Tokyo, Japan

[73] Assignee: NEC Corporation, Tokyo, Japan

[21] Appl. No.: 493,158

[22] Filed: Jun. 21, 1995

[30] Foreign Application Priority Data

Jun. 21, 1994 [JP] Japan .................................. 6-138821

[51] Int. Cl.$^6$ ................................................ H04L 25/06
[52] U.S. Cl. ........................................ 375/317; 375/341
[58] Field of Search ........................... 375/262, 340, 375/341, 317; 371/43, 44, 45; 329/318, 319, 321, 349, 351

[56] References Cited

U.S. PATENT DOCUMENTS 5,425,037  6/1995  Uesugi et al. ...................... 375/341 X

FOREIGN PATENT DOCUMENTS

| 2-288512 | 11/1990 | Japan . | |
|---|---|---|---|
| 3-284021 | 12/1991 | Japan . | |
| 4-501945 | 4/1992 | Japan . | |
| 9106165 | 5/1991 | WIPO | H04L 27/01 |

OTHER PUBLICATIONS

"Soft Decision Technique", Journal of the IECE of Japan, 1984, 67(5):564–568.
Proakis, *Digital Communications*, McGraw–Hill, 2nd Edition, 1989, pp. 548–555.
Hagenauer et al., "A Viterbi Algorithm with Soft–Decision Outputs and its Applications", Proc. Globecom, 1989, pp. 1680–1686.

*Primary Examiner*—Stephen Chin
*Assistant Examiner*—Kevin Kim
*Attorney, Agent, or Firm*—Foley & Lardner

[57] ABSTRACT

A receive condition in burst transmission varies in units of a burst or a plurality of symbol times. The present invention provides a soft decision signal outputting receiver which can simply produce correct reliability information even if the receive condition varies while employing a simple reliability information production method. A demodulator demodulates a burst signal to obtain a hard decision signal. A time-varying reliability information production circuit receives information of a demodulation process from the demodulator 11 and produces reliability information regarding the hard decision signal. The time-varying reliability information production circuit receives signal quality information which reflects a receive condition for each burst or each plurality of symbol times, and changes, based on the signal quality information, a production method for reliability information or elements such as threshold levels to be used in a production method for each burst or each plurality of symbol times. A soft decision signal production circuit produces a soft decision signal from the hard decision signal and the reliability information.

30 Claims, 18 Drawing Sheets

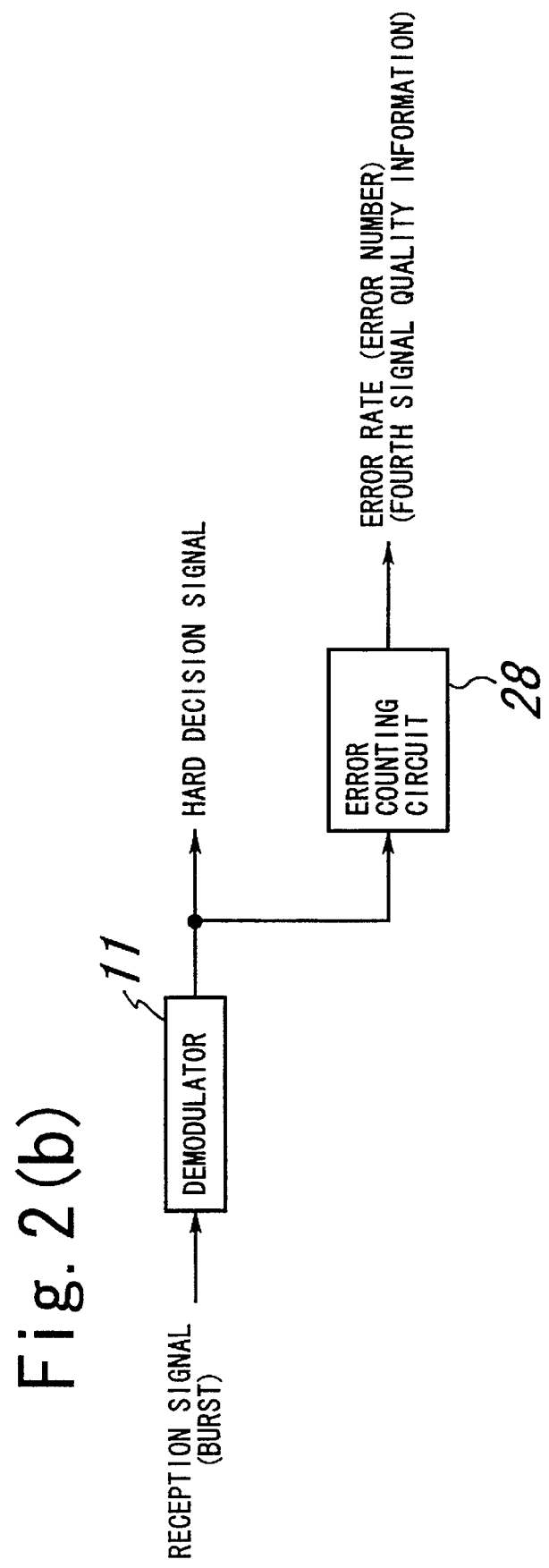

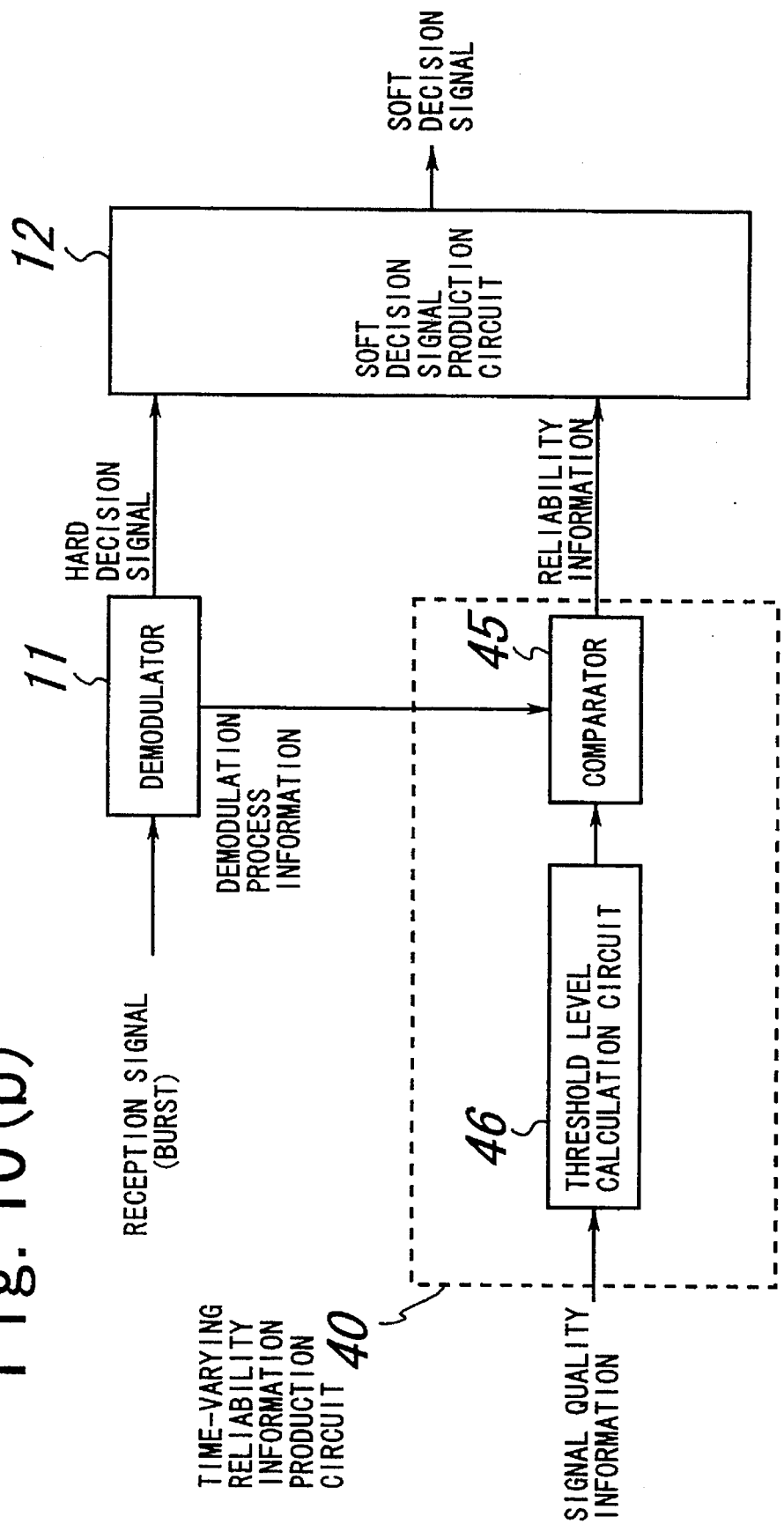

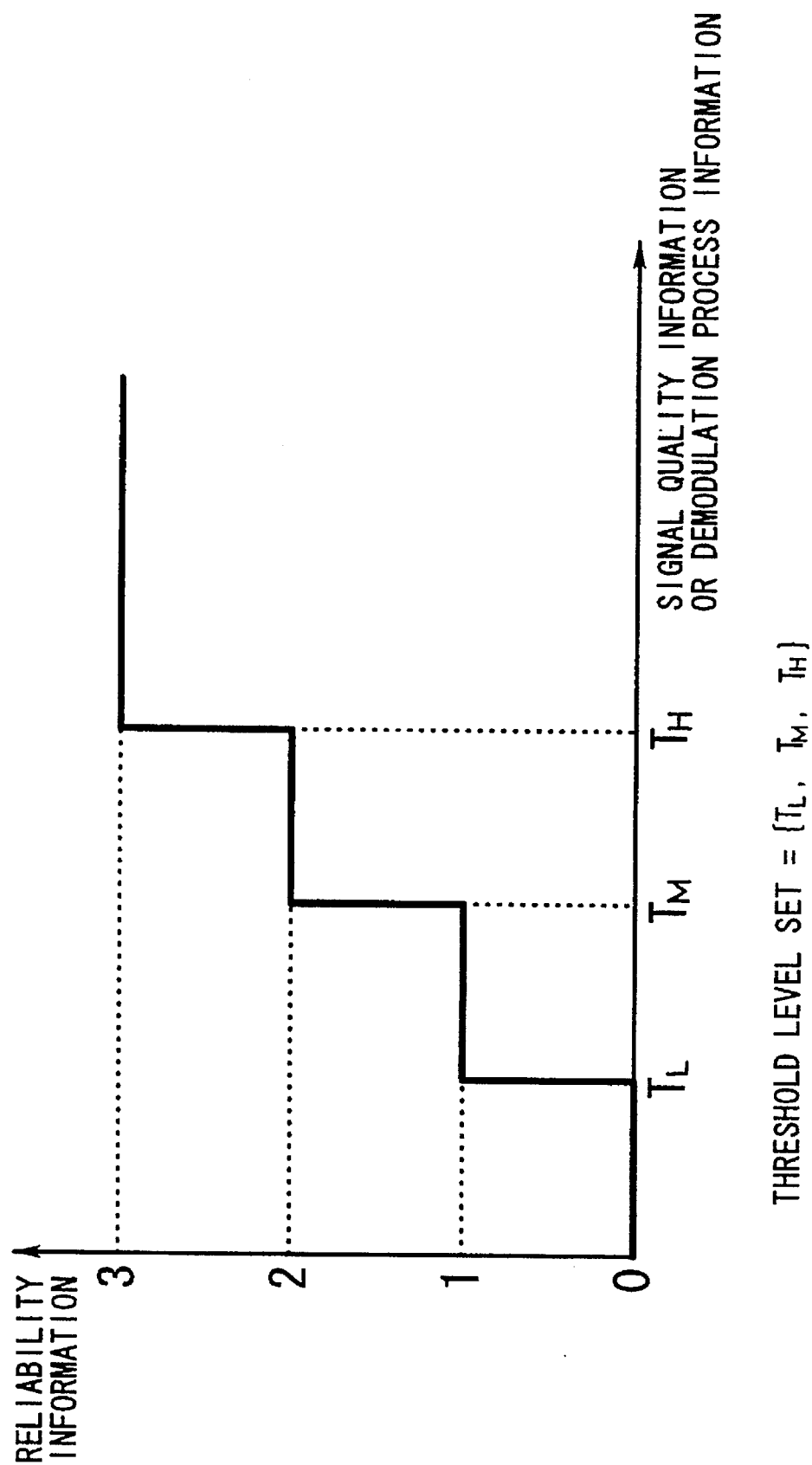

SOFT DECISION SIGNAL OUTPUTTING RECEIVER

BACKGROUND OF THE INVENTION

1. Field of the Invention

This invention relates to a soft decision signal outputting receiver which outputs, in reception in transmission of a burst signal, a soft decision signal which improves the error correction capability of an error correction decoder to allow data transmission of a high degree of reliability.

2. Description of the Related Art

It is known that, where an error correction code is used, if soft decision decoding wherein a soft decision receive signal is received as an input can be performed, then the correction capability can be improved comparing with hard decision decoding. For example, under white gaussian noise, a coding gain of approximately 2 db in signal-to-noise ratio is obtained by 8-value soft decision decoding comparing with hard decision decoding (refer to, for example, "Soft Decision Technique", *Journal of the IECE of Japan*, Vol. 67, No. 5, pp. 564–568, 1984).

Meanwhile, in order to transmit data in a channel in which inter-symbol interference occurs, an equalization method for removing an influence of the inter-symbol interference of the channel is required on the receiver side. Particularly, maximum-likelihood sequence estimation (MLSE) is known as an equalization method most suitable to minimize the error rate (for example, John G. Proakis, *Digital Communications*, second edition, McGraw-Hill, 1989). Accordingly, in order to perform communications with a high degree of accuracy using equalization and error correction decoding simultaneously, it is desirable to employ optimum methods for both of them, that is, to employ maximum-likelihood sequence estimation for the equalization method and employ soft decision decoding for the decoding method.

Various methods have been investigated to obtain a soft decision output from a maximum-likelihood sequence estimator including, for example, "Data signal reception method and apparatus" disclosed in Japanese Patent Laid-Open Application No. Heisei 03-284021, "Method of and apparatus for correcting a Viterbi algorithm" disclosed in Japanese Patent Laid-Open Application No. Heisei 2-288512, "Method of generating a quality coefficient of a binary value obtained by a Viterbi analysis of a signal" disclosed in Japanese Patent Laid-Open Application No. Heisei 4-501945, "SOFT DECISION DECODING WITH CHANNEL EQUALIZATION" (WO91/06165), and J. Hagenauer and P. Hoeher, "A Viterbi Algorithm with Soft-Decision Outputs and its Applications", *Proc. GLOBECOM*, 1989, Dallas, Tex., pp. 1,680–1,686, Nov. 1989.

However, in such a case that burst transmission is performed in mobile communications or the like, the receive condition (a signal to cochannel interference ratio, a signal to noise ratio or the like) sometimes varies by a great amount in units of a burst or a plurality of symbol times. If a fixed method which does not take a difference in receive condition into consideration is used for a plurality of burst signals whose receive conditions are much different from each other, then reliability information is produced from references which are equivalently different for the individual bursts. Consequently, the conventional method described above is disadvantageous in that the reliability information does not necessarily reflect the true reliability. Further, while a reliability information production method has been proposed, which takes a difference in a part of receive conditions into account, it is disadvantageous in that the processing is complicated.

SUMMARY OF THE INVENTION

It is an object of the present invention to provide a soft decision signal outputting receiver which can simply produce correct reliability information even if the receive condition is different among different bursts while using a simple reliability information production method.

In order to attain the object described above, according to an aspect of the present invention, there is provided a soft decision signal outputting receiver, which comprises a demodulator for modulating a burst signal and outputting a hard decision signal, a reliability information production circuit for producing reliability information regarding the hard decision signal from signal quality information for each plurality of symbol times, and a soft decision signal production circuit for producing a soft decision signal from the hard decision signal and the reliability information.

According to another aspect of the present invention, there is provided a soft decision signal outputting receiver, which comprises a demodulator for modulating a burst signal and outputting a hard decision signal, a reliability information production circuit for receiving demodulation process information from the demodulator and producing reliability information regarding the hard decision signal, a soft decision signal production circuit for producing a soft decision signal from the hard decision signal and the reliability information, and changing means for changing the production method for reliability information for each plurality of symbol times based on signal quality information for the plurality of symbol times.

The changing means may have a plurality of production methods for reliability information prepared in advance and selectively use one of the production methods for each plurality of symbol times. Alternatively, the changing means may have a plurality of sets of threshold levels prepared in advance and select one of the sets of threshold levels to be used for each plurality of symbol times based on signal quality information, and the reliability information production circuit may compare the demodulation process information from the demodulator with the thus selected set of threshold levels to obtain reliability information.

According to a further aspect of the present invention, there is provided soft decision signal outputting receiver, which comprises a demodulator for modulating a burst signal and outputting a hard decision signal, a reliability information production circuit-for receiving demodulation process information from the demodulator and producing reliability information regarding the hard decision signal, a reliability information correction circuit for correcting the reliability information based on signal quality information for each plurality of symbol times to obtain a corrected reliability information value, and a soft decision signal production circuit for producing a soft decision signal from the hard decision signal and the corrected reliability information value.

According to a still further aspect of the present invention, there is provided a soft decision signal outputting receiver, which comprises a demodulator for modulating a burst signal and outputting a hard decision signal, a reliability information production circuit for receiving demodulation process information from the demodulator and producing reliability information regarding the hard decision signal, a soft decision signal production circuit for producing a tentative soft decision signal from the hard decision signal and the reliability information, and a soft decision signal correction circuit for correcting the tentative soft decision signal based on signal quality information for each plurality of symbol times and outputting the corrected soft decision signal as a soft decision signal.

Preferably, the plurality of symbol times are equal to a time of one burst length.

The reliability information production circuit may compare the demodulation process information with a predetermined plurality of threshold levels to obtain reliability information.

The demodulator may perform maximum-likelihood sequence estimation.

Or, the demodulator may perform maximum-likelihood sequence estimation and produce demodulation process information based on an error signal of a channel estimator used for maximum-likelihood sequence estimation.

Or else, the demodulator may perform maximum-likelihood sequence estimation and produce demodulation process information based on a difference in path metric between states in maximum-likelihood sequence estimation.

The signal quality information for each plurality of symbol times may include, solely or in combination, an average value or a minimum value of a received signal strength indicator within the plurality of symbol times or an average value for the plurality of symbol times of a variation amount of a received signal strength indicator between symbols.

Or, where the plurality of symbol times is set equal to a time of one burst length, the signal quality information for each burst time may include, solely or in combination, an average value or a minimum value of a received signal strength indicator within the burst or an average value within the burst of a variation amount of a received signal strength indicator between symbols.

Or else, wherein the plurality of symbol times is set equal to a time of one burst length, the signal quality information for each burst time may include, solely or in combination, a number of errors upon demodulation of a known signal portion within the burst, a mean square value of an error signal of the demodulator, or an unequalizable interference amount obtained from a known signal portion within the burst.

In high speed burst transmission, a receive condition varies in units of a burst or in units of a plurality of symbol times. In this instance, if the reliability information production process in units of a symbol is adaptively varied in accordance with reliability information in units of a burst or a plurality of symbol times, or if reliability information in units of a symbol obtained separately is corrected with reliability information in units of a burst or a plurality of symbol times, then a variation of the receive condition can be reflected on production of reliability information by simple processing.

With the soft decision signal outputting receivers of the present invention described above, such adaptive variation of the reliability information production process or such correction of reliability information as described just above is involved. Consequently, a soft decision signal output of a high quality which reflects a receive condition which varies in units of a burst or a plurality of symbol times in a transmission system which performs burst transmission is obtained from the soft decision signal outputting receivers. Data transmission with a high degree of reliability can be performed as the soft decision signal is supplied to an error correction decoder, by which soft decision error correction is performed.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIGS. 2(a), 2(b) and 2(c) are block diagrams showing different production methods for signal quality information which may be employed in the soft decision signal outputting receiver of FIG. 1;

FIGS. 10(a) and 10(b) are block diagrams showing modifications to the circuit shown in FIG. 9;

FIG. 11 is a graph illustrating an example of a reliability information production method;

DESCRIPTION OF THE PREFERRED EMBODIMENTS

Several embodiments of the present invention will be described below with reference to the drawings. While the embodiments described below involve two-value modulation, the present invention can be applied to multiple-value modulation of three or more values.

Figure 3:
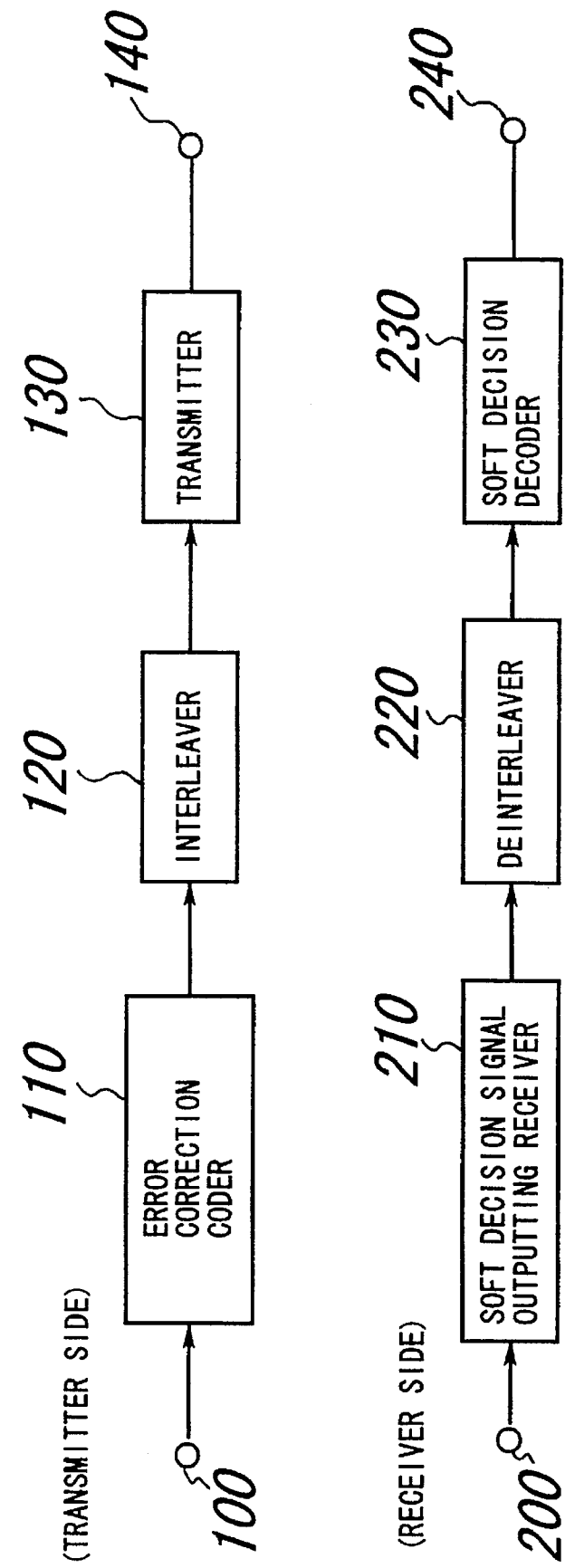
FIG. 3 is a block diagram showing a receiver side system in which the soft decision signal outputting receiver of FIG. 1 is employed together with a transmitter side system.

Referring first to FIG. 3, a soft decision signal outputting receiver 210 of the present invention exhibits its effect where it is employed together with a. deinterleaver 220 and a soft decision decoder 230 in a receiver side system. In order to cope with this, a transmitter side system is constructed such that a data sequence is error-correction coded by an error correction coder 110 and interleaved and modulated by an interleaver 120, whereafter it is transmitted by a transmitter 130. It is to be noted that, in FIG. 3, reference numeral 100 denotes a data input terminal, 140 a transmission signal output terminal, 200 a reception signal input terminal, and 240 a decision data signal output terminal.

Figure 4:
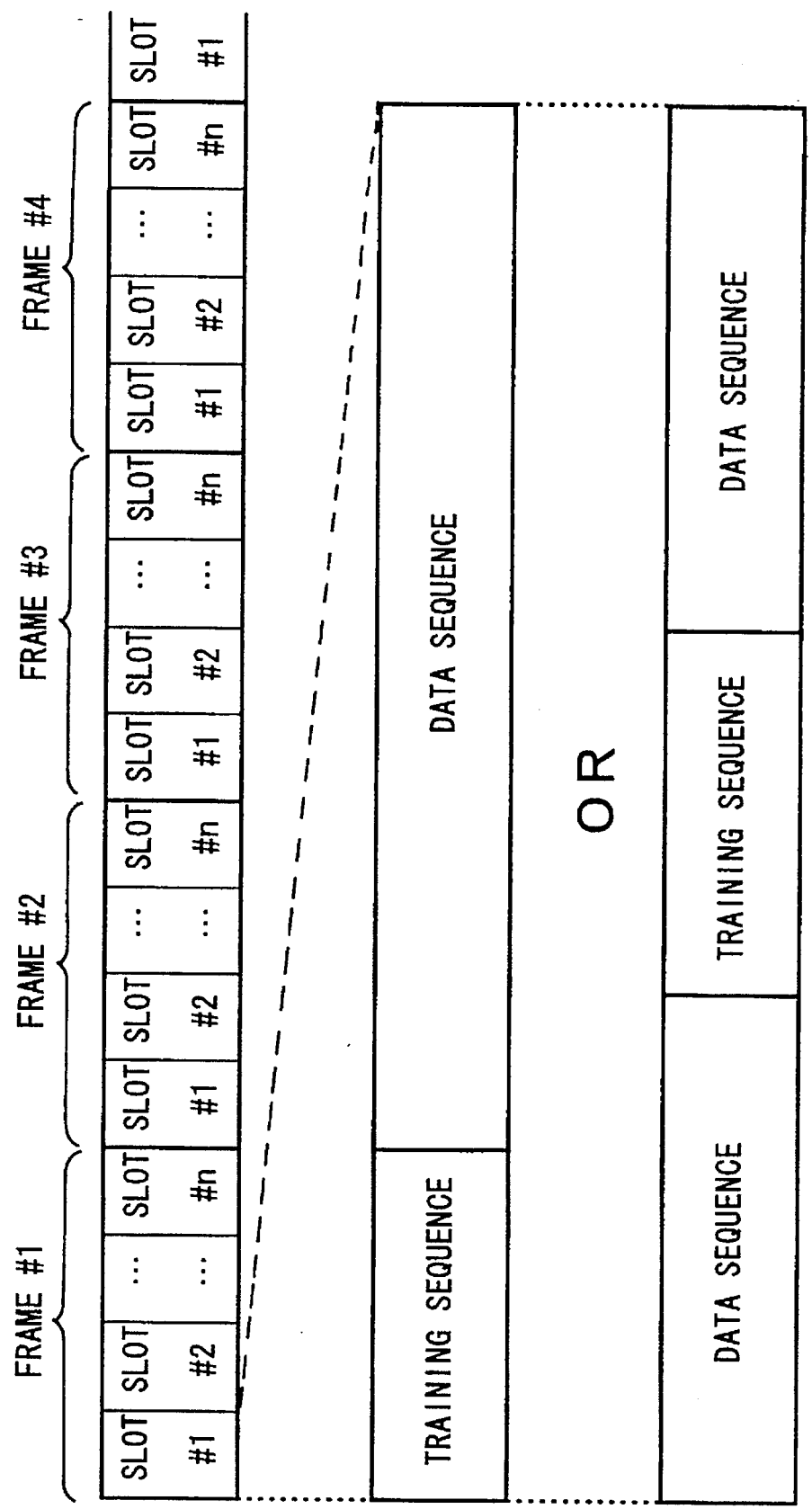
FIG. 4 is a diagrammatic view showing an example of a burst signal format.

In mobile communications and so forth, a signal is in most cases transmitted in bursts. For example, in TDMA (Time Division Multiple Access) burst transmission illustrated in FIG. 4, successive time units called slots are allocated to individual users in a frame, and a signal is transmitted within the time of a slot allocated to each user. In this example, one burst length is equal to one slot length. Each frame is divided into n slots each including a training sequence and a data sequence or a front stage data sequence, a training sequence and a rear stage data sequence.

Figure 5:
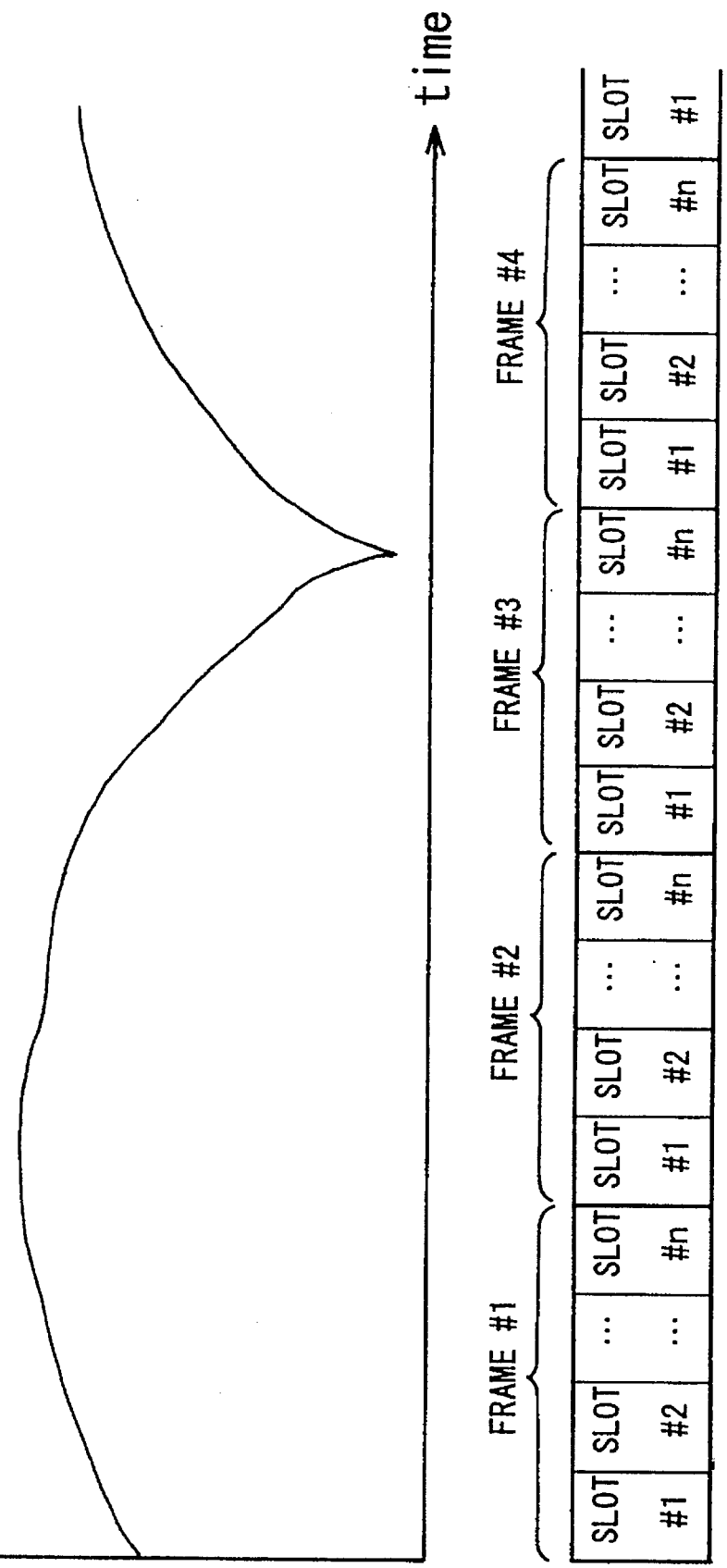
FIG. 5 is a diagrammatic view illustrating an example of a time variation of the received signal strength indicator upon high speed burst transmission.

By the way, in mobile communications and so forth, it sometimes occurs that, as seen in FIG. 5, the signal level fluctuated by fading does not change very much within one burst and a fade of the signal is concentrated upon a particular slot. This phenomenon is observed when burst transmission rate is much higher than the fading frequency. In this instance, the receive condition as represented by the signal to cochannel interference ratio or the signal-to-noise ratio varies in units of a burst. A soft decision signal is produced from a hard decision signal and the reliability of the hard decision signal, and the reliability depends much upon the receive condition of a signal. Accordingly, in high speed burst transmission, the reliability does not exhibit a great difference between symbols within a same burst, but rather exhibits a great difference in units of a burst. Further, where also interleaving is employed, since signals distributed once to different bursts in a channel by the interleaver 120 shown in FIG. 3 are collected by the deinterleaver 220 so that they may appear successively in time, the difference in reliability between decision signals for different bursts has an increasing influence on the soft decision decoding characteristic of the soft decision decoder 230 of FIG. 3.

In summary, in high speed burst transmission which involves interleaving, if the reliability of a hard decision signal upon production of a soft decision signal is determined with the quality of a reception signal for each burst and a same reliability is used within a same burst, then a soft decision signal which takes a receive condition, which varies significantly between bursts, into consideration can be produced by a very simple method. The soft decision signal outputting receiver of the first embodiment of the present invention has been proposed based on the concept just described.

Figure 1:
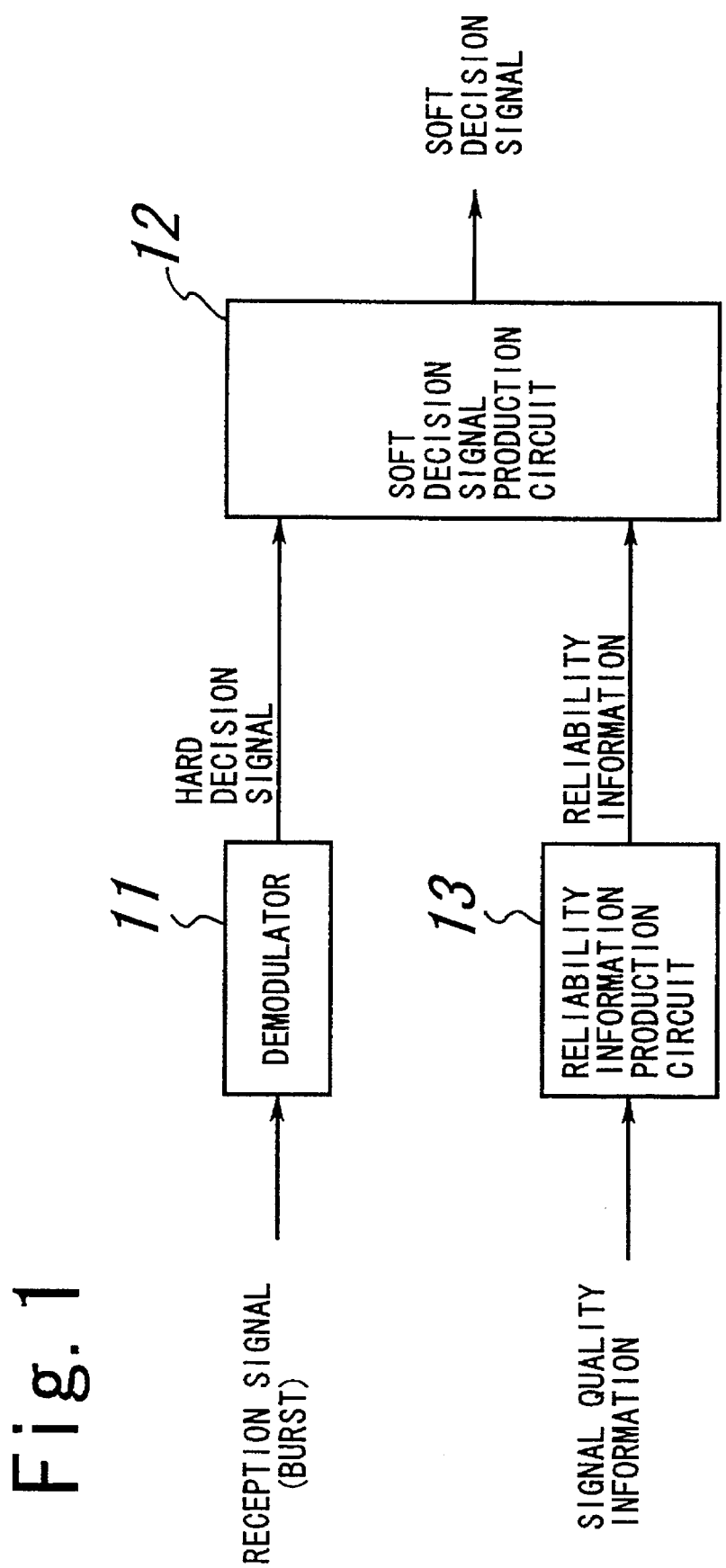
FIG. 1 is a block diagram showing a basic construction of a soft decision signal outputting receiver according to the present invention.

FIG. 1 shows a basic construction of the soft decision signal outputting receiver of the first embodiment of the present invention. Referring to FIG. 1, the soft decision signal outputting receiver shown includes a demodulator 11, a soft decision signal production circuit 12 and a reliability information production circuit 13. A received burst signal is inputted to the demodulator 11, from which a binary (two-value, here "0" and "1") hard decision signal train is obtained. Meanwhile, signal quality information which reflects a receive condition of a received burst is detected separately, and the signal quality information is converted into reliability information by the reliability information production circuit 13. For example, in order to produce 4-value reliability information, the reliability information production circuit 13 operates to perform such simple processing as to compare the value of signal quality information with a set of three threshold levels {$T_L$, $T_M$, $T_H$} prepared in advance to convert it into reliability information of four values of "0", "1", "2" and "3" (here, the reliability increases as the value increases) in accordance with the relationship in magnitude between them. While the reliability information in the present embodiment is described to be four-value information, generally the reliability information is a multiple value signal (of M values) having a greater number of levels in accordance with the necessity. The reliability information production circuit 13 thus produces 2M-value soft decision signals from individual hard decision signals and such reliability information. For example, when the hard decision signal is a two-value signal of "0" and "1" and the reliability information is a four-value signal of "0" to "3", a hard decision signal is converted into an 8-value soft decision signal of "0" to "7" by one of such conversion methods as described below:

CONVERSION EXAMPLE 1

Independently of the value of the hard decision signal, (soft decision signal)=(hard decision signal)×4+(reliability information)

CONVERSION EXAMPLE 2

When the value of the hard decision signal is "1", (soft decision signal)=(hard decision signal)×4+(reliability information)

When the value of the hard decision signal is "0", (soft decision signal)=(hard decision signal)×4+(3−(reliability information))

Whichever conversion method is employed, where the 8-value soft decision signal is represented by 3 bits, the most significant bit (MSB) is formed based on the value of the hard decision signal, and the other bits are formed based on the reliability information. The soft decision signal obtained in such a manner as described above reflects a difference in receive condition for each burst since the reliability information thereof is produced based on signal quality information for each burst.

Figure 2A:
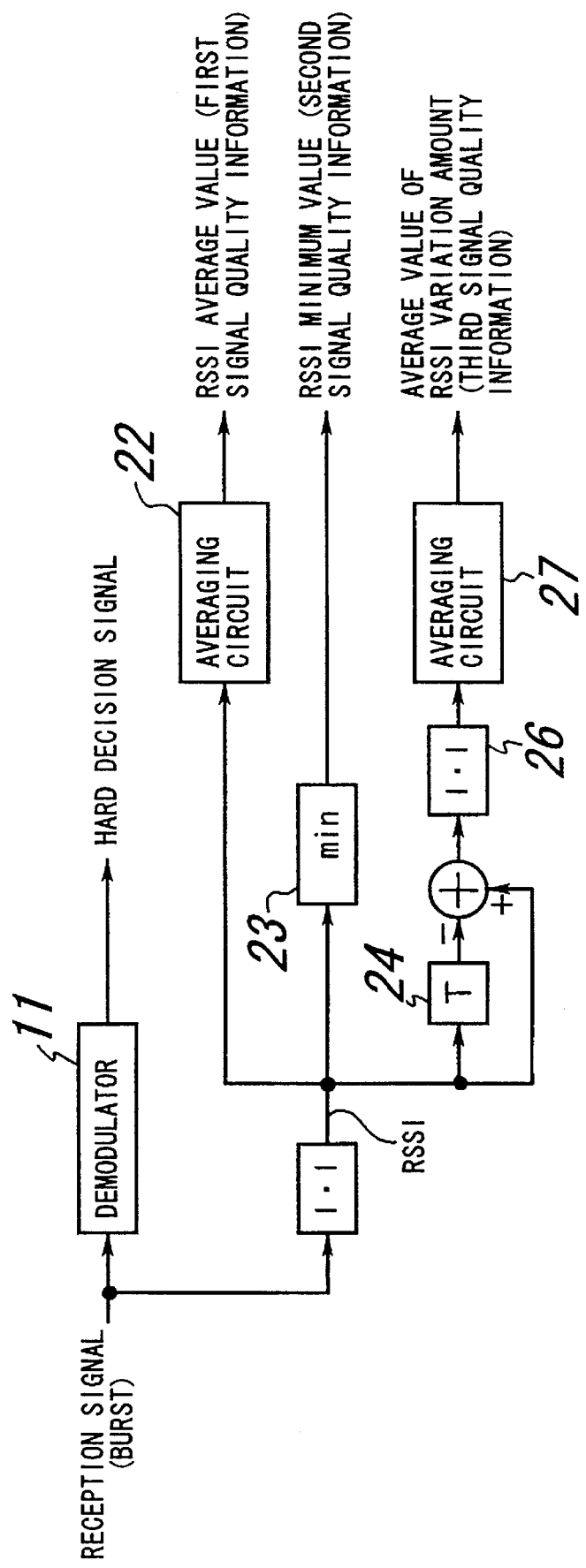
Figure 2C:
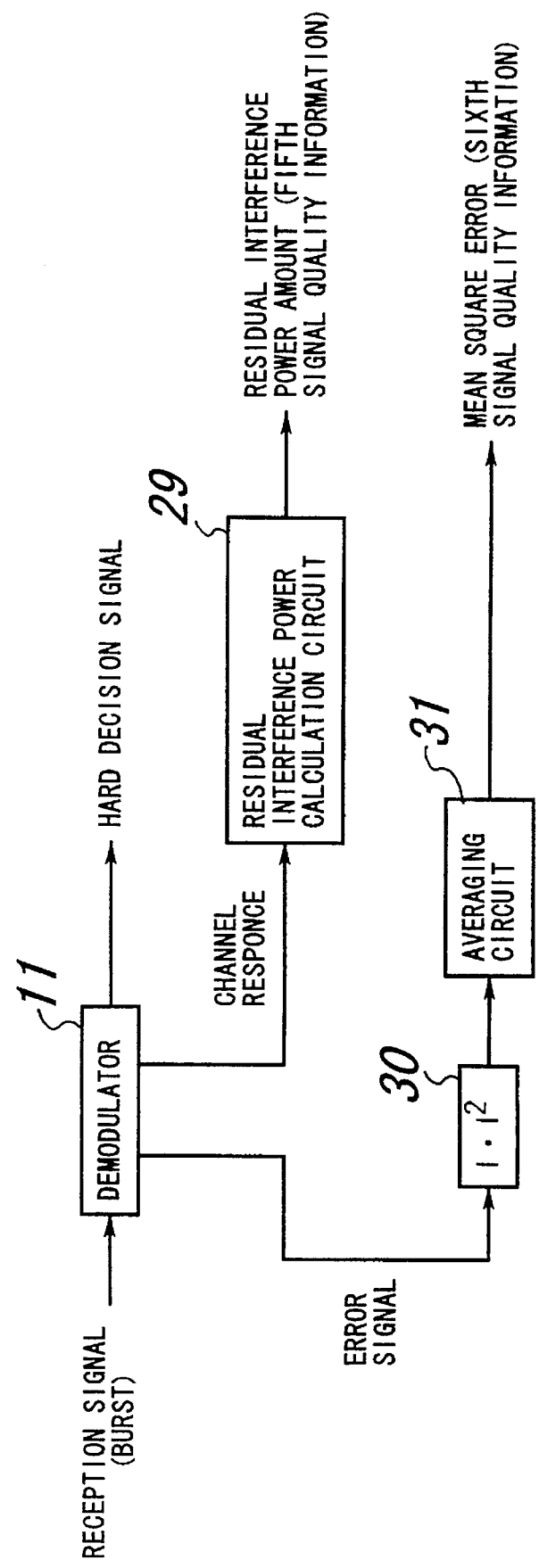

As the signal quality information which can be used to produce reliability information, information detected by any of such circuits as shown in FIGS. 2(a), 2(b) and 2(c) can be used. The detection circuit shown in FIG. 2(a) defines signal quality information based on a received signal strength indicator (RSSI) and includes a signal amplitude detector 21 whose output is divided into three routes. As the first route, an RSSI average value in a burst (first signal quality information) is extracted by an averaging circuit 22; as the second route, an RSSI minimum value in a burst (second signal quality information) is extracted by a minimum value detection circuit 23; and as the third route, an average value of an RSSI variation amount between symbols (third signal quality information) is extracted by a delay element 24 of a symbol time T, a subtractor (or difference detector) 25, an absolute value detector 26 and an averaging circuit 27.

Figure 6:
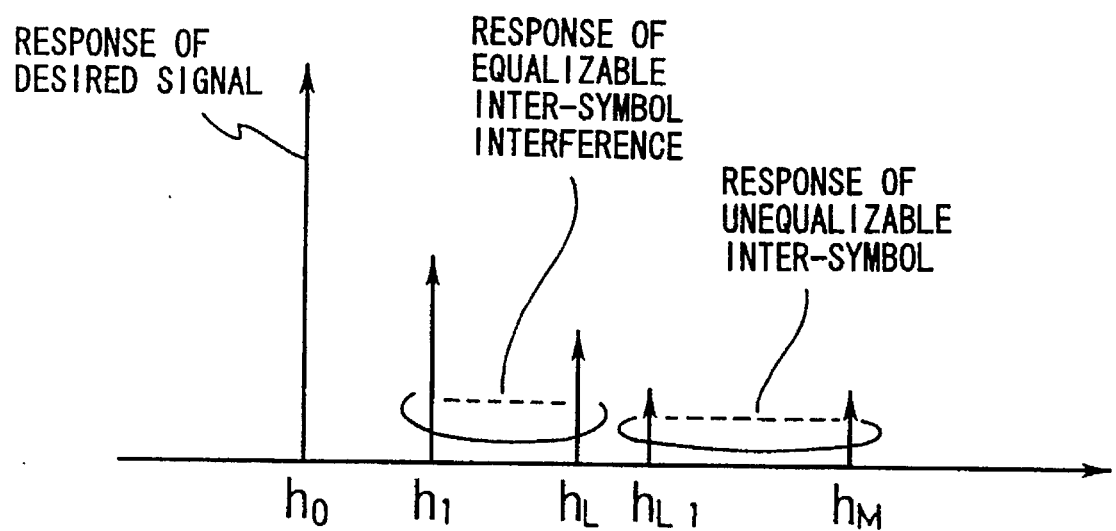
FIG. 6 is a diagram illustrating an example of a channel response.

The detection circuit of FIG. 2(b) defines signal quality information based on an error rate of demodulated signals and includes a demodulator 11, and an error counting circuit 28 which detects, from a hard decision signal from the demodulator 11, an error rate or a number of errors (fourth signal quality information) when training signal portions in a burst are demodulated. The detection circuit of FIG. 2(c) defines signal quality information based on information of a process of demodulation of a demodulator 11 and includes a residual interference power calculation circuit 29 which calculates a residual interference power amount (fifth signal quality information) from a channel response from the demodulator 11, or a squaring circuit 30 which squares an error signal from the demodulator 11 and an averaging circuit 31 which averages an output of the squaring circuit 30 to extract a mean square error (sixth signal quality information value). Here, the residual interference power amount is a power of a channel response regarding intersymbol interference which cannot be equalized by the demodulator 11, and for the demodulator 11 in this instance, it is presumed to use a demodulator which has an equalizer such as a maximum-likelihood sequence estimation (MLSE). In particular, for the residual interference power amount, a value obtained by normalization with a power of the entire channel response is used, and in the case of a channel having such an impulse response as seen in FIG. 6, it is calculated in the following manner:

$$\sum_{k=L+1}^{M} |h_k|^2 / \sum_{k=0}^{M} |h_k|^2 \quad (1)$$

where hk(k=0, M) is the channel response, h0 is the response of a desired wave, hk(k=1, L) is the channel response in an equalizable range, and hk(k=L+1, M) is a channel response out of the equalizable range.

While the signal quality information may be represented in any information by itself mentioned above, it may otherwise be represented in a combination of a plurality of pieces of information such as a combination of the RSSI average value and the residual interference power amount.

In the foregoing description, signal qulaity information bearing receive condition obtained burst by burst, and it gives the equal reliability information for all the decision signals during the entire burst. However, in the case of low burst transmission rate, the receive condition changes even within one burst period. In such a case, signal quality information should be calculated in units of a block which has a time length of a plurality of symbols shorter than one burst length when one burst is divided into a plurality of blocks so that reliability information should be produced in units of a block.

A soft decision signal outputting receiver according to the second embodiment of the present invention produces reliability information from demodulation process information provided by the demodulator for each decision signals. And it also changes the reliability information production method itself based on burst-wise or block-wise signal quality information so that it produces reliability information which reflects a difference in receive condition for each burst or block. A basic construction of the soft decision signal outputting receiver of the second embodiment of the present invention is shown in FIG. 7.

Figure 7:
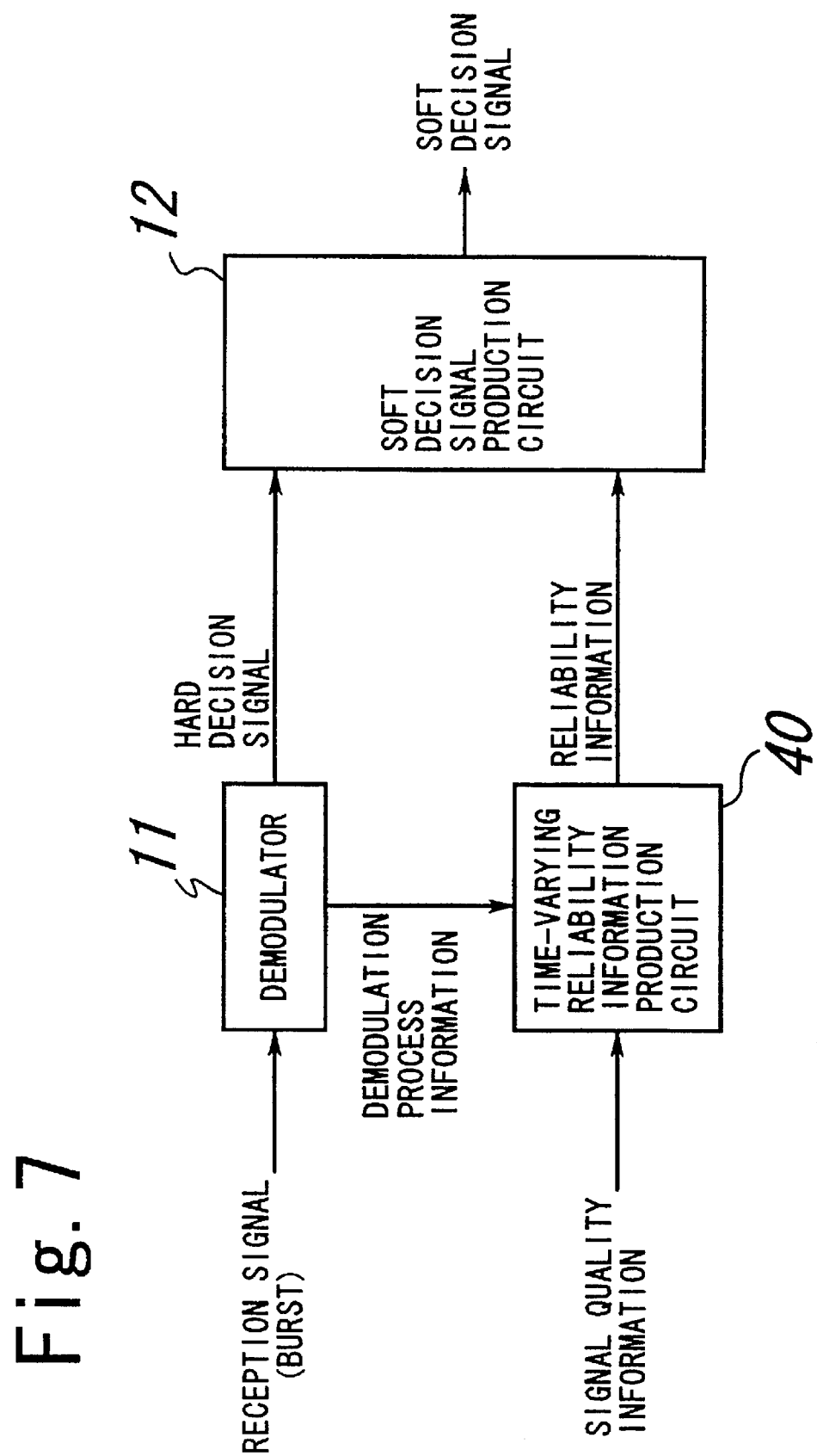
FIG. 7 is a block diagram showing a basic construction of another soft decision signal outputting receiver according to the present invention.

Referring to FIG. 7, a demodulator 11 demodulates a burst signal to obtain a hard decision signal. A time-varying reliability information production circuit 40 receives symbol-wise information of demodulation process from the demodulator 11 and produces reliability information regarding the hard decision signal. A decision error signal may be used as the demodulation process information. The time-varying reliability information production circuit 40 receives signal quality information for each burst or block time and changes the reliability information production method for each burst or block time based on the signal quality information. A soft decision signal production circuit 12 produces a soft decision signal from the hard decision signal and the reliability information.

In burst transmission through the channel with intersymbol interference, a demodulator having an equalizer such as a maximum-likelihood sequence estimator (MLSE) is used for the demodulator 11. In this instance, for example, an error signal of a channel estimator, a difference in path metric of survivor paths for different states or the like can be used for the demodulation process information. Further, various pieces of information similar to those of the first embodiment of the present invention or any combination of them may be used for the signal quality information.

The following methods may be used for time-varying reliability information production based on burst-wise or block-wise signal quality information as an example.

Figure 9:
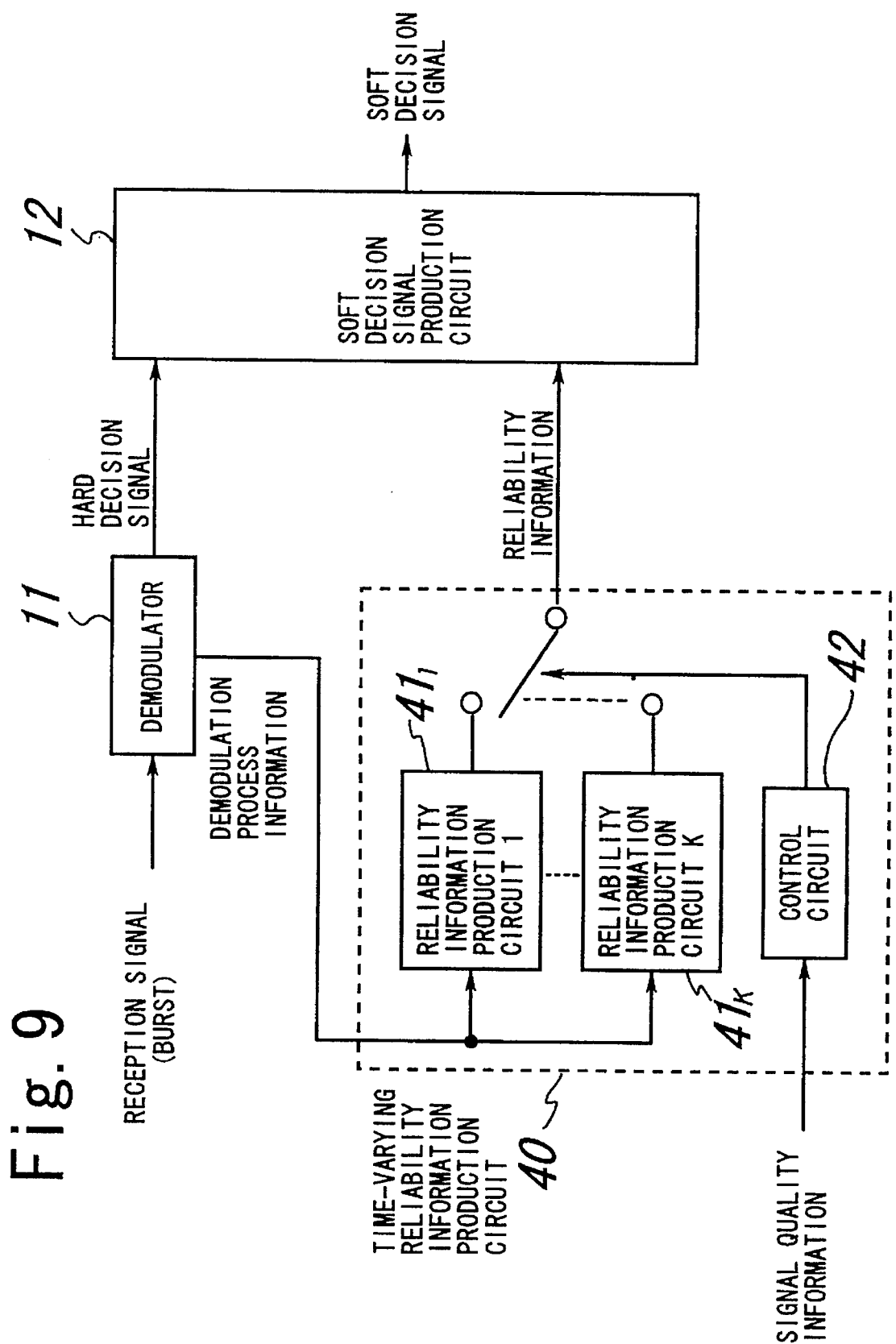
FIG. 9 is a block diagram of the soft decision signal outputting receiver of FIG. 7 showing details of a circuit which time-varies a production method for reliability information based on signal quality information for each burst or block time.

1) A plurality of reliability information production methods are prepared in advance, and one of the production methods which is suitable for a receive condition then is selected in response to signal quality information. A time-varying reliability information production circuit 40 which employs the method just described is shown in FIG. 9. In this instance, the time-varying reliability information production circuit 40 includes k reliability information production circuits 41₁ to 41ₖ for producing reliability information then from demodulation process information provided by the demodulator 11, and a control circuit 42 for selecting one of the reliability information production circuits 41₁ to 41ₖ in accordance with the signal quality information.

Figure 10A:
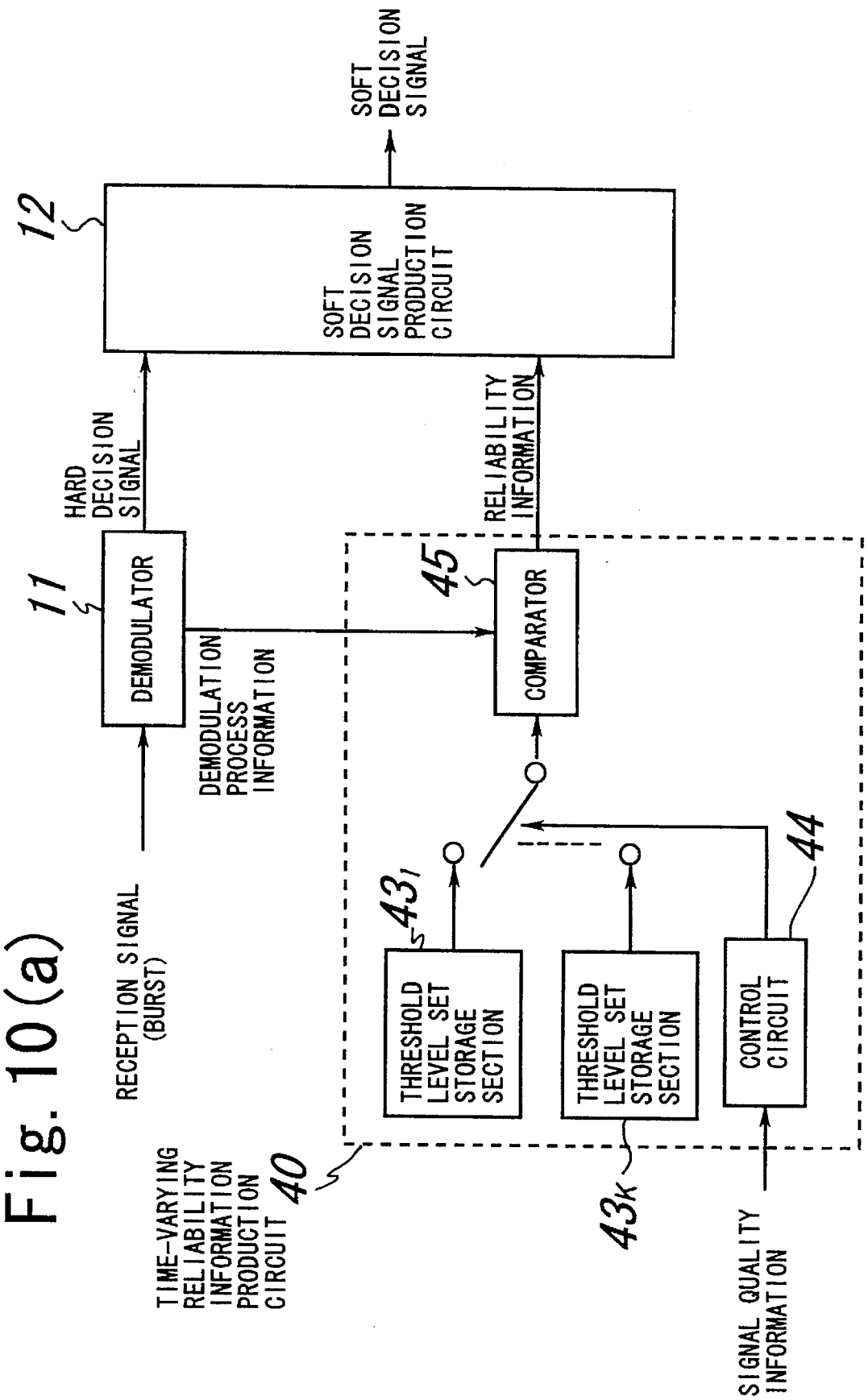

2) The reliability information production method may be fixed to such a simple method that, for example, demodulation process information is compared with a plurality of threshold levels so as to be converted into reliability information, and the production method may be changed equivalently by varying a threshold level to be used with respect to time. In this instance, a method wherein a plurality of threshold levels are prepared in advance and a parameter set suitable for a receive condition then is selected based on signal quality information or another method wherein a parameter suitable for a receive condition is calculated based on signal quality information every time it is required. A time-varying reliability information production circuit 40 which employs the former method is shown in FIG. 10(a). Referring to FIG. 10(a), the time-varying reliability information production circuit 40 in this instance includes k threshold level set storage sections 43₁ to 43ₖ, a control circuit 44 for selecting one of the threshold level set storage sections 43₁ to 43ₖ in response to signal quality information, and a comparator 45 for comparing demodulation process information from the demodulator 11 with the threshold level selected by the control circuit 44 to obtain reliability information. A time-varying reliability information production circuit which employs the latter method includes, as seen in FIG. 10(b), a single threshold level calculation circuit 46 in place of the threshold level set storage sections 43₁ to 43ₖ and the control circuit 44 of the circuit of FIG. 10(a).

Figure 8:
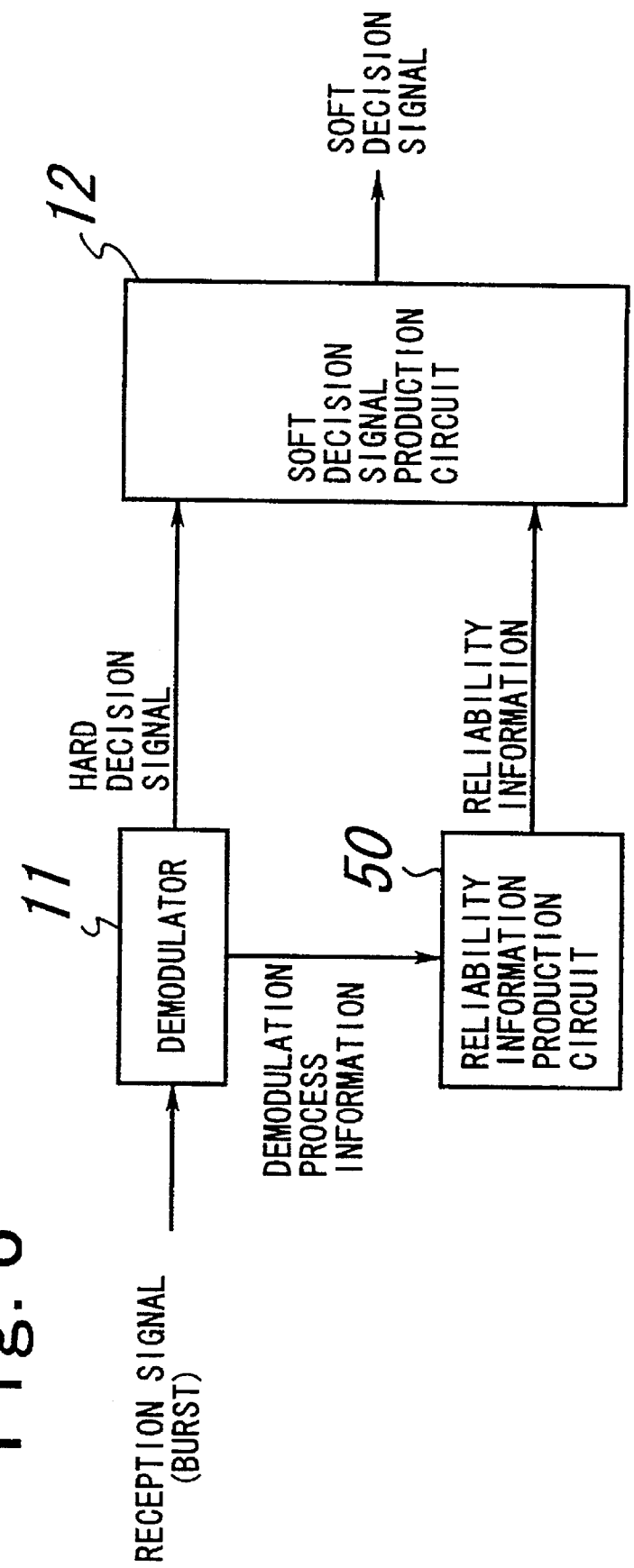
FIG. 8 is a block diagram showing a conventional soft decision outputting receiver.

Comparing with the soft decision signal outputting receiver of the second embodiment of the present invention described above, a conventional soft decision outputting receiver is different in that a reliability information production circuit 50 produces reliability information only from demodulation process information from the demodulator 11 as seen from FIG. 8.

A soft decision signal outputting receiver according to a third preferred embodiment of the present invention corrects reliability information obtained once in units of a burst or a block based on signal quality information to produce reliability information which reflects a difference in receive condition for each burst or block. Two examples of a construction of the soft decision signal outputting receiver are shown in FIGS. 12(a) and 12(b).

Figure 12A:
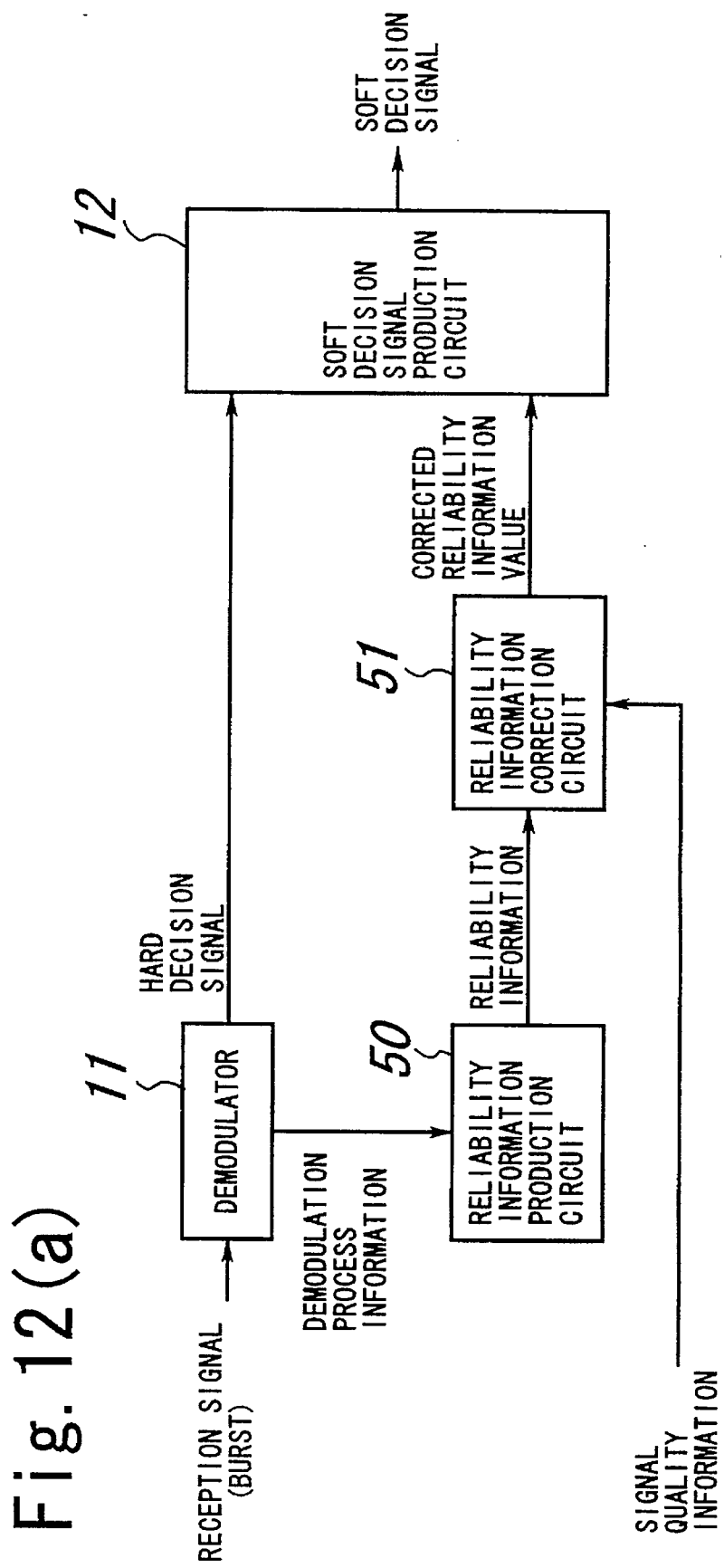
FIGS. 12(a) and 12(b) are block diagrams showing a further soft decision signal outputting receiver according to the present invention and a modification to it, respectively.
Figure 12:
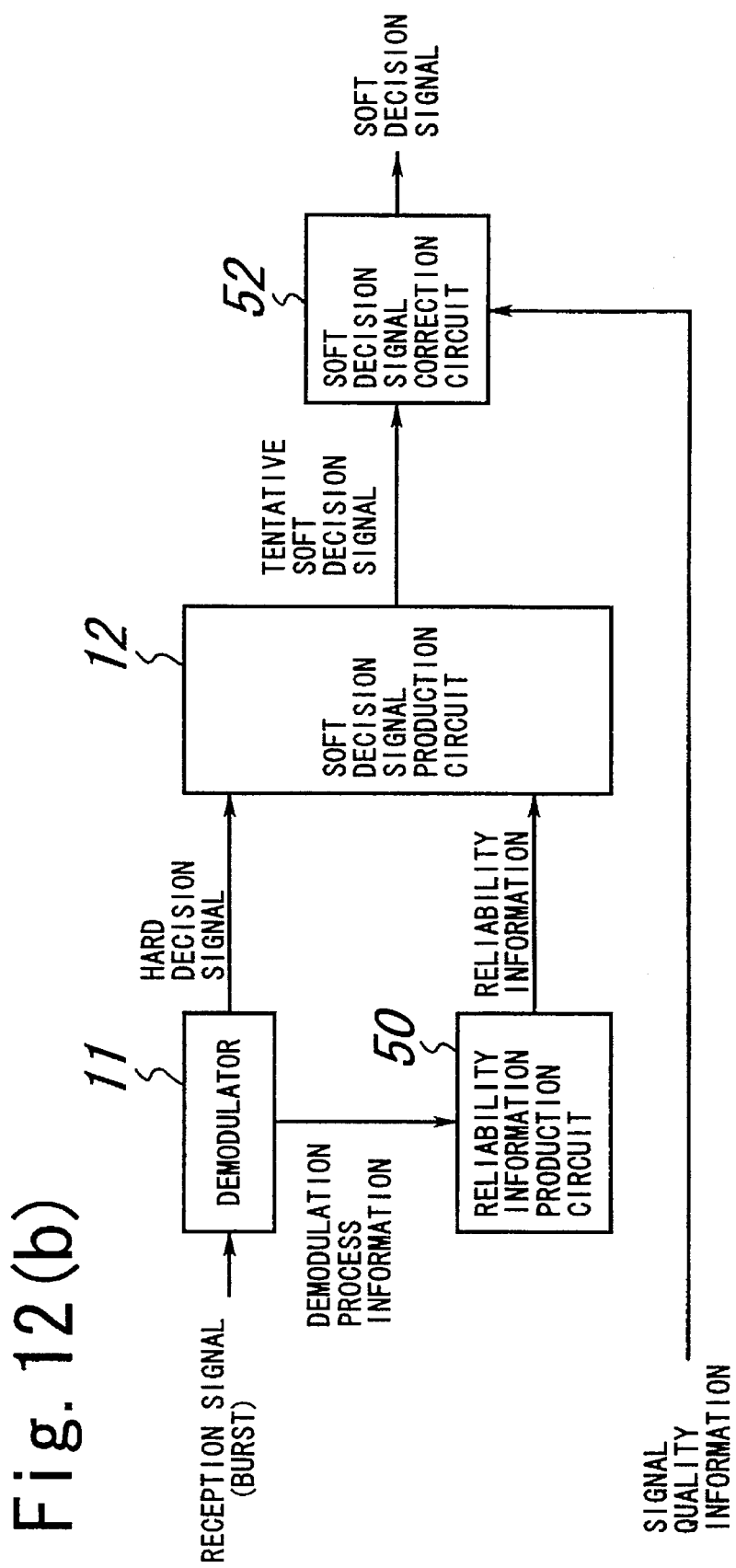

Referring first to FIG. 12(a), in the soft decision signal outputting receiver shown, a demodulator 11 demodulates a burst signal to obtain a hard decision signal. A reliability information production circuit 50 receives demodulation process information from the demodulator 11 and produces reliability information regarding the hard decision signal. A reliability information correction circuit 51 receives signal quality information for each burst or block time and corrects reliability information inputted thereto based on the signal quality information. The correction processing is performed commonly for reliability information within the burst or the block time. A soft decision signal production circuit 12 produces a soft decision signal from the hard decision signal and the corrected reliability information value obtained by the correction processing.

In burst transmission through the channel with intersymbol interference, a demodulator having an equalizer such as a maximum-likelihood sequence eatimator (MLSE) is used for the demodulator 11. In this instance, for example, an error signal of a channel estimator, a difference in path metric value of a survivor path between states or the like can be used for the demodulation process information. Further, similar pieces of information to those in the first embodiment of the present invention or any combination of them can be used for the signal quality information.

Figure 13A:
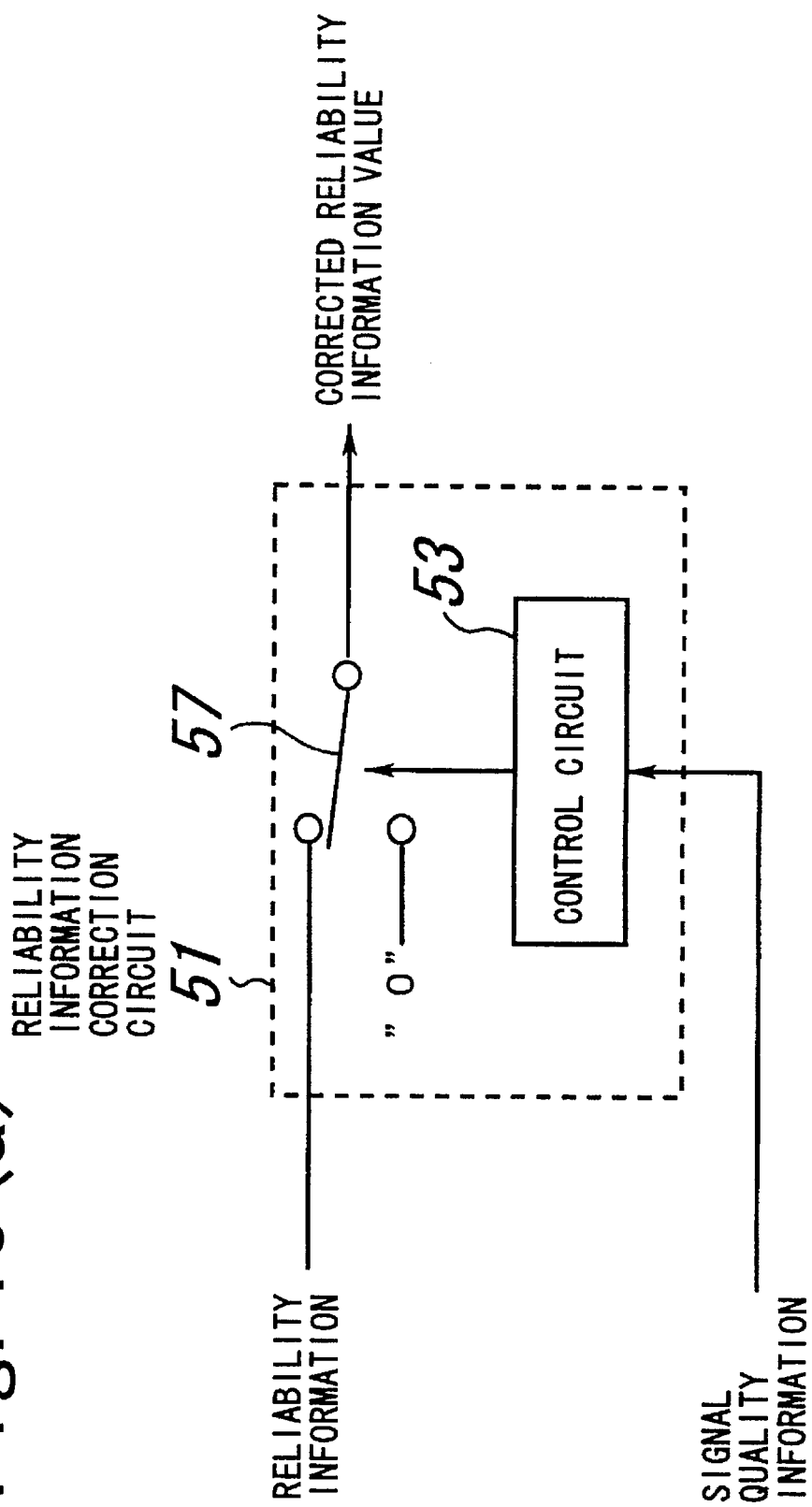
FIGS. 13(a) and 13(b) are block diagrams showing different examples of a construction of a reliability information correction circuit.
Figure 13B:
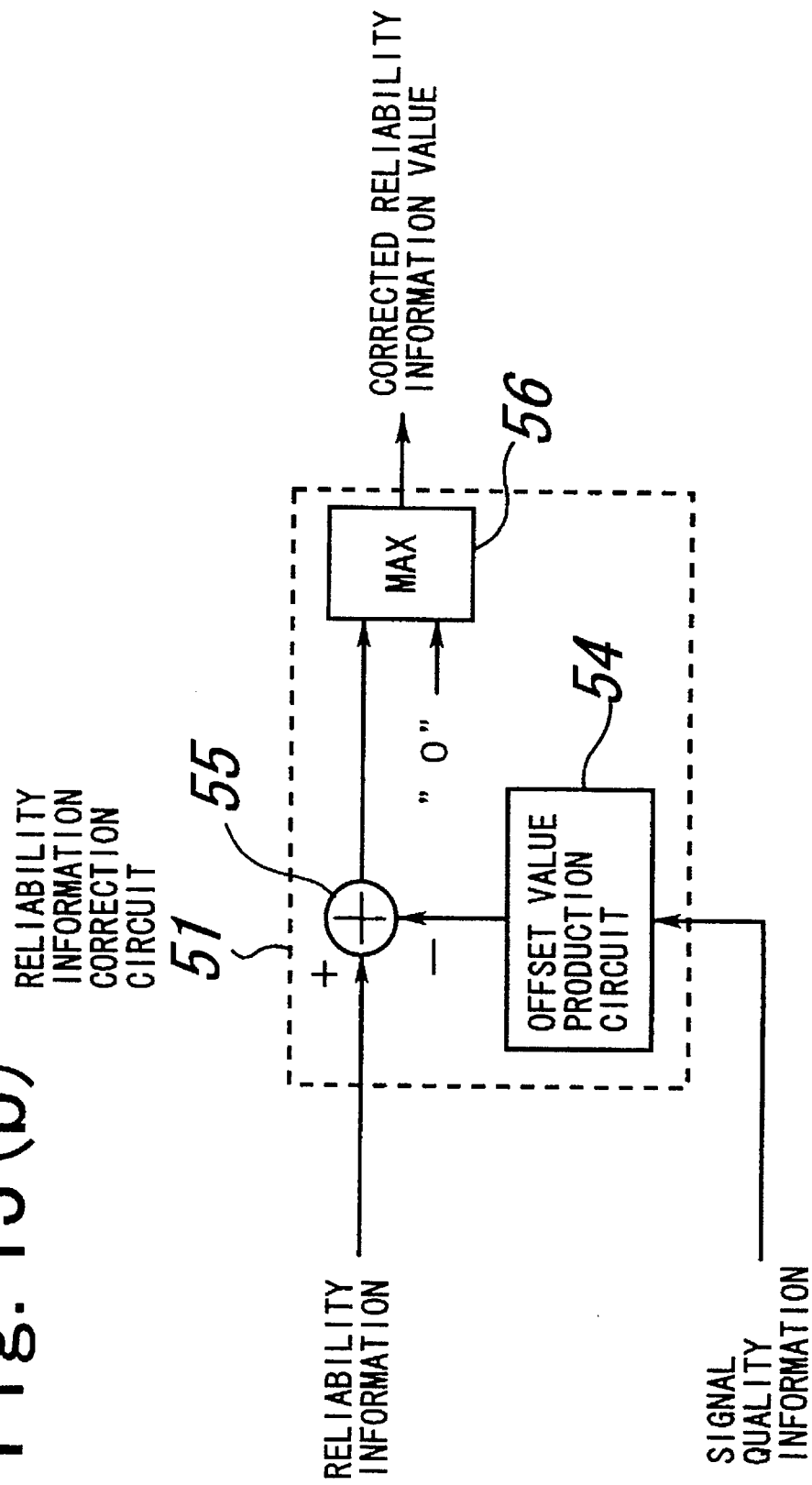

The reliability information correction circuit 51 may have such a construction as shown, for example, in FIG. 13(a) or 13(b). In the reliability information correction circuit 51 of the construction shown in FIG. 13(a), a switch 57 is switched in response to signal quality information by a control circuit 53 such that, when it is determined that the signal quality for each burst or block time is high, reliability information inputted within the burst or the block time is outputted as it is, but when the signal quality is determined to be low, reliability information inputted is all converted into and outputted as a fixed value (for example, the lowest value of "0"). Meanwhile, in the reliability information correction circuit 51 of the construction shown in FIG. 13(b), an offset value from all offset value production circuit 54 is subtracted from inputted reliability information by a subtractor 55, and a maximum value detected by a maximum value detector 56 is determined as a corrected reliability information value (in this instance, the lowest of the corrected value is set to "0"). In this instance, the offset value to be subtracted is maintained within the burst or the block time whereas it may be determined based on signal quality information.

In the meantime, in the soft decision signal outputting receiver shown in FIG. 12(b) which is a modification to the soft decision signal outputting receiver shown in FIG. 12(a), a tentative soft decision signal is produced from a hard decision signal from a demodulator 11 and reliability information from a reliability information production circuit 50 by a soft decision signal production circuit 12, and the soft decision signal is corrected in accordance with signal quality information by a soft decision signal correction circuit 52.

While the three soft decision signal outputting receivers according to the first to third preferred embodiments of the present invention are described above, the processing described above may be performed by software using a digital signal processor (DSP).

Having now fully described the invention, it will be apparent to one of ordinary skill in the art that many changes and modifications can be made thereto without departing from the spirit and scope of the invention as set forth herein.

What is claimed is:

1. A soft decision signal outputting receiver, comprising:
   a demodulator for modulating a burst signal and outputting a hard decision signal;
   a reliability information production circuit for producing reliability information regarding the hard decision signal from signal quality information for each plurality of symbol times; and
   a soft decision signal production circuit for producing a soft decision signal from the hard decision signal and the reliability information;
   wherein the plurality of symbol times is set equal to a time of one burst length, and the signal quality information for each burst time includes at least one of a number of errors upon demodulation of a known signal portion within the burst, a mean square value of an error signal of said demodulator, and an unequalizable interference amount obtained from a known signal portion within the burst.

2. A soft decision signal outputting receiver, comprising:
   a demodulator for modulating a burst signal and outputting a hard decision signal;
   a reliability information production circuit for receiving demodulation process information from said demodulator and producing reliability information regarding the hard decision signal;
   a soft decision signal production circuit for producing a soft decision signal from the hard decision signal and the reliability information; and
   changing means for changing the production method for reliability information for each plurality of symbol times based on signal quality information for the plurality of symbol times.

3. A soft decision signal outputting receiver as claimed in claim 2, wherein said changing means has a plurality of production methods for reliability information prepared in advance and selectively uses one of the production methods for each plurality of symbol times.

4. A soft decision signal outputting receiver as claimed in claim 2, wherein said changing means has a plurality of sets of threshold levels prepared in advance and selects one of the sets of threshold levels to be used for each plurality of symbol times based on signal quality information, and said reliability information production circuit compares the demodulation process information from said demodulator with the thus selected set of threshold levels to obtain reliability information.

5. A soft decision signal outputting receiver as claimed in claim 2, wherein the plurality of symbol times are equal to a time of one burst length.

6. A soft decision signal outputting receiver as claimed in claim 2, wherein said reliability information production circuit compares the demodulation process information with a predetermined plurality of threshold levels to obtain reliability information.

7. A soft decision signal outputting receiver as claimed in claim 2, wherein said demodulator performs maximum-likelihood sequence estimation.

8. A soft decision signal outputting receiver as claimed in claim 2, wherein said demodulator performs maximum-likelihood sequence estimation and produces demodulation process information based on an error signal of a channel estimator used for maximum-likelihood sequence estimation.

9. A soft decision signal outputting receiver as claimed in claim 2, wherein said demodulator performs maximum-likelihood sequence estimation and produces demodulation process information based on a difference in path metric between states in maximum-likelihood sequence estimation.

10. A soft decision signal outputting receiver as claimed in claim 2, wherein the signal quality information for each plurality of symbol times includes at least one of an average value or a minimum value of a received signal strength indicator within the plurality of symbol times and an average value for the plurality of symbol times of a variation amount of a received signal strength indicator between symbols.

11. A soft decision signal outputting receiver as claimed in claim 2, wherein the plurality of symbol times is set equal to a time of one burst length, and the signal quality information for each burst time includes at least one of an average value or a minimum value of a received signal strength indicator within the burst and an average value within the burst of a variation amount of a received signal strength indicator between symbols.

12. A soft decision signal outputting receiver as claimed in claim 2, wherein the plurality of symbol times is set equal to a time of one burst length, and the signal quality information for each burst time includes at least one of a number of errors upon demodulation of a known signal portion within the burst, a mean square value of an error signal of said demodulator, and an unequalizable interference amount obtained from a known signal portion within the burst.

13. A soft decision signal outputting receiver, comprising:
a demodulator for modulating a burst signal and outputting a hard decision signal;
a reliability information production circuit for receiving demodulation process information from said demodulator and producing reliability information regarding the hard decision signal;
a reliability information correction circuit for correcting the reliability information based on signal quality information for each plurality of symbol times to obtain a corrected reliability information value; and
a soft decision signal production circuit for producing a soft decision signal from the hard decision signal and the corrected reliability information value.

14. A soft decision signal outputting receiver as claimed in claim 13, wherein the plurality of symbol times are equal to a time of one burst length.

15. A soft decision signal outputting receiver as claimed in claim 13, wherein said reliability information production circuit compares the demodulation process information with a predetermined plurality of threshold levels to obtain reliability information.

16. A soft decision signal outputting receiver as claimed in claim 13, wherein said demodulator performs maximum-likelihood sequence estimation.

17. A soft decision signal outputting receiver as claimed in claim 13, wherein said demodulator performs maximum-likelihood sequence estimation and produces demodulation process information based on an error signal of a channel estimator used for maximum-likelihood sequence estimation.

18. A soft decision signal outputting receiver as claimed in claim 13, wherein said demodulator performs maximum-likelihood sequence estimation and produces demodulation process information based on a difference in path metric between states in maximum-likelihood sequence estimation.

19. A soft decision signal outputting receiver as claimed in claim 13, wherein the signal quality information for each plurality of symbol times includes at least one of an average value or a minimum value of a received signal strength indicator within the plurality of symbol times and an average value for the plurality of symbol times of a variation amount of a received signal strength indicator between symbols.

20. A soft decision signal outputting receiver as claimed in claim 13, wherein the plurality of symbol times is set equal to a time of one burst length, and the signal quality information for each burst time includes at least one of an average value or a minimum value of a received signal strength indicator within the burst and an average value within the burst of a variation amount of a received signal strength indicator between symbols.

21. A soft decision signal outputting receiver as claimed in claim 13, wherein the plurality of symbol times is set equal to a time of one burst length, and the signal quality information for each burst time includes at least one of a number of errors upon demodulation of a known signal portion within the burst, a mean square value of an error signal of said demodulator, and an unequalizable interference amount obtained from a known signal portion within the burst.

22. A soft decision signal outputting receiver, comprising:
a demodulator for modulating a burst signal and outputting a hard decision signal;
a reliability information production circuit for receiving demodulation process information from said demodulator and producing reliability information regarding the hard decision signal;
a soft decision signal production circuit for producing a tentative soft decision signal from the hard decision signal and the reliability information; and
a soft decision signal correction circuit for correcting the tentative soft decision signal based on signal quality information for each plurality of symbol times and outputting the corrected soft decision signal as a soft decision signal.

23. A soft decision signal outputting receiver as claimed in claim 22, wherein the plurality of symbol times are equal to a time of one burst length.

24. A soft decision signal outputting receiver as claimed in claim 22, wherein said reliability information production circuit compares the demodulation process information with a predetermined plurality of threshold levels to obtain reliability information.

25. A soft decision signal outputting receiver as claimed in claim 22, wherein said demodulator performs maximum-likelihood sequence estimation.

26. A soft decision signal outputting receiver as claimed in claim 22, wherein said demodulator performs maximum-likelihood sequence estimation and produces demodulation process information based on an error signal of a channel estimator used for maximum-likelihood sequence estimation.

27. A soft decision signal outputting receiver as claimed in claim 22, wherein said demodulator performs maximum-likelihood sequence estimation and produces demodulation process information based on a difference in path metric between states in maximum-likelihood sequence estimation.

28. A soft decision signal outputting receiver as claimed in claim 22, wherein the signal quality information for each plurality of symbol times includes at least one of an average value or a minimum value of a received signal strength indicator within the plurality of symbol times and an average value for the plurality of symbol times of a variation amount of a received signal strength indicator between symbols.

29. A soft decision signal outputting receiver as claimed in claim 22, wherein the plurality of symbol times is set equal to a time of one burst length, and the signal quality information for each burst time includes at least one of an average value or a minimum value of a received signal strength indicator within the burst and an average value within the burst of a variation amount of a received signal strength indicator between symbols.

30. A soft decision signal outputting receiver as claimed in claim 22, wherein the plurality of symbol times is set equal to a time of one burst length, and the signal quality information for each burst time includes at least one of a number of errors upon demodulation of a known signal portion within the burst, a mean square value of an error signal of said demodulator, and an unequalizable interference amount obtained from a known signal portion within the burst.

* * * * *